US012785670B2

(12) United States Patent
Wu et al.

(10) Patent No.: US 12,785,670 B2
(45) Date of Patent: Nov. 3, 2026

(54) CHIP DATA TRANSFER INTERFACE AND SEMICONDUCTOR DEVICE

(71) Applicants: Global Unichip Corporation, Hsinchu (TW); Taiwan Semiconductor Manufacturing Company, Ltd., Hsinchu (TW)

(72) Inventors: Chen-Lung Wu, Hsinchu (TW); Wen-Lung Tu, Hsinchu (TW); Chia-Hsiang Chang, Hsinchu (TW); Shih-Hsuan Hsu, Hsinchu (TW)

(73) Assignees: Global Unichip Corporatin, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 21 days.

(21) Appl. No.: 19/174,900

(22) Filed: Apr. 9, 2025

(65) Prior Publication Data

US 2026/0291474 A1 Sep. 24, 2026

(30) Foreign Application Priority Data

Mar. 18, 2025 (TW) ................................ 114109960

(51) Int. Cl.
*G06F 1/12* (2006.01)
*H03K 5/01* (2006.01)
*H03K 5/00* (2006.01)

(52) U.S. Cl.
CPC ................. *H03K 5/01* (2013.01); *G06F 1/12* (2013.01); *H03K 2005/00058* (2013.01)

(58) Field of Classification Search
CPC ... G06F 1/12; H03K 5/01; H03K 2005/00058
(Continued)

(56) References Cited

U.S. PATENT DOCUMENTS 11,385,675 B2 * 7/2022 Chang ....................... H03L 7/07
11,392,193 B2 7/2022 Tajalli
(Continued)

FOREIGN PATENT DOCUMENTS

CN 102891600 9/2014
CN 104300788 3/2017
(Continued)

OTHER PUBLICATIONS

"Office Action of Taiwan Counterpart Application", issued on Nov. 17, 2025, p. 1-p. 8.

*Primary Examiner* — William Hernandez
(74) *Attorney, Agent, or Firm* — JCIPRNET

(57) ABSTRACT

Provided are a chip data transfer interface and a semiconductor device. The chip data transfer interface includes a data receiving circuit, a data transfer circuit, a clock supply circuit, and a phase modulation circuit. The data receiving circuit is configured to receive a parallel input data according to a first operation clock and send a parallel output data. The data transfer circuit is coupled to the data receiving circuit and configured to receive the parallel output data based on a second operation clock and send a serial data. The clock supply circuit is coupled to the data receiving circuit and the data transfer circuit. The clock supply circuit is configured to generate a system clock and the second operation clock based on a source clock. The phase modulation circuit is coupled to the data receiving circuit and the clock supply circuit.

12 Claims, 6 Drawing Sheets

200

(58) Field of Classification Search
USPC .................................................. 327/261, 355
See application file for complete search history.

(56) References Cited

U.S. PATENT DOCUMENTS

| | | | | |
|---|---|---|---|---|
| 11,662,765 | B1 * | 5/2023 | Nagarajan | G06F 1/12 713/400 |
| 2005/0246469 | A1 * | 11/2005 | Chu | G06F 13/385 710/301 |
| 2007/0028012 | A1 * | 2/2007 | Nonoyama | G06F 13/4072 710/33 |
| 2007/0028013 | A1 * | 2/2007 | Nonoyama | G06F 13/4072 710/33 |
| 2008/0270656 | A1 * | 10/2008 | Bracamontes Del Toro | G06F 13/4045 710/110 |

FOREIGN PATENT DOCUMENTS

| | | |
|---|---|---|
| CN | 109478081 | 3/2019 |
| CN | 113688081 | 11/2021 |
| CN | 116974330 | 10/2023 |
| CN | 117420880 | 1/2024 |
| CN | 118414590 | 7/2024 |
| TW | 201120628 | 6/2011 |
| TW | I387871 | 3/2013 |
| TW | 201409243 | 3/2014 |

* cited by examiner

The phase of CLK1 leads the phase of CLK_S1

400A

The phase of CLK1 lags behind the phase of CLK_S1

400B

500

CLK1 and CLK_S1 are phase-locked with each other

CHIP DATA TRANSFER INTERFACE AND SEMICONDUCTOR DEVICE

CROSS-REFERENCE TO RELATED APPLICATION

This application claims the priority benefit of Taiwan application serial no. 114109960, filed on Mar. 18, 2025. The entirety of the above-mentioned patent application is hereby incorporated by reference herein and made a part of this specification.

BACKGROUND

Technical Field

The disclosure relates to a chip data transfer interface, and in particular relates to a chip data transfer interface configured to provide digital data transfer and a semiconductor device having the chip data transfer interface.

Related Art

Dynamic voltage/frequency scaling is a smart load management technology, which can dynamically adjust a voltage and an operating frequency supplied to a chip based on a current workload of the chip. For example, when the chip is in an idle or low load state, dynamic voltage/frequency scaling may reduce the voltage and allow the chip to operate at a lower frequency in order to reduce power consumption. On the other hand, when the chip needs to perform high-intensity computation or is in a working state, dynamic voltage/frequency scaling may increase the voltage and allow the chip to operate at a higher frequency to meet the performance needs.

SUMMARY

The disclosure provides a chip data transfer interface and a semiconductor device, which are configured to correct a delay of signal caused by dynamic voltage/frequency scaling to ensure to correctly perform digital data transfer.

The chip data transfer interface of the disclosure includes a data receiving circuit, a data transfer circuit, a clock supply circuit, and a phase modulation circuit. The data receiving circuit is configured to receive a parallel input data according to a first operation clock, and send a parallel output data. The data transfer circuit is coupled to the data receiving circuit, and configured to receive the parallel output data based on a second operation clock, and send a serial data. The clock supply circuit is coupled to the data receiving circuit and the data transfer circuit. The clock supply circuit is configured to generate a system clock and the second operation clock based on a source clock. The phase modulation circuit is coupled to the data receiving circuit and the clock supply circuit. The phase modulation circuit is configured to receive the system clock and the first operation clock, and allow the first operation clock to be in phase with the system clock. When the first operation clock is in phase with the system clock, the clock supply circuit is configured to output the second operation clock, and the second operation clock is synchronized with the first operation clock.

The semiconductor device of the disclosure includes a first chip and a second chip. The first chip has a chip data transfer interface. The second chip is coupled to the chip data transfer interface. The chip data transfer interface includes: a data receiving circuit, a data transfer circuit, a clock supply circuit, and a phase modulation circuit. The data receiving circuit is configured to receive a parallel input data according to a first operation clock, and send a parallel output data. The data transfer circuit is coupled to the data receiving circuit, and configured to receive the parallel output data based on a second operation clock, and send a serial data. The clock supply circuit is coupled to the data receiving circuit and the data transfer circuit. The clock supply circuit is configured to generate a system clock and the second operation clock based on a source clock. The phase modulation circuit is coupled to the data receiving circuit and the clock supply circuit. The phase modulation circuit is configured to receive the system clock and the first operation clock, and allow the system clock to be in phase with the first operation clock. When the system clock is in phase with the first operation clock, the clock supply circuit is configured to output the second operation clock, and the second operation clock is synchronized with the first operation clock.

Based on the above, the chip data transfer interface and the semiconductor device of the disclosure may keep the system clock and the first operation clock to be phase-locked. Therefore, data on the chip data transfer interface may be normally transferred. That is to say, the chip data transfer interface can ensure that a setup/hold timing margin of the chip data transfer interface may not be affected in a condition where dynamic voltage/frequency scaling is utilized to reduce power consumption in order to correctly perform digital data transfer.

In order to make the features and advantages of the disclosure more comprehensible, the following examples are given and described in detail with the accompanying drawings as follows.

DESCRIPTION OF THE EMBODIMENTS

Figure 1:
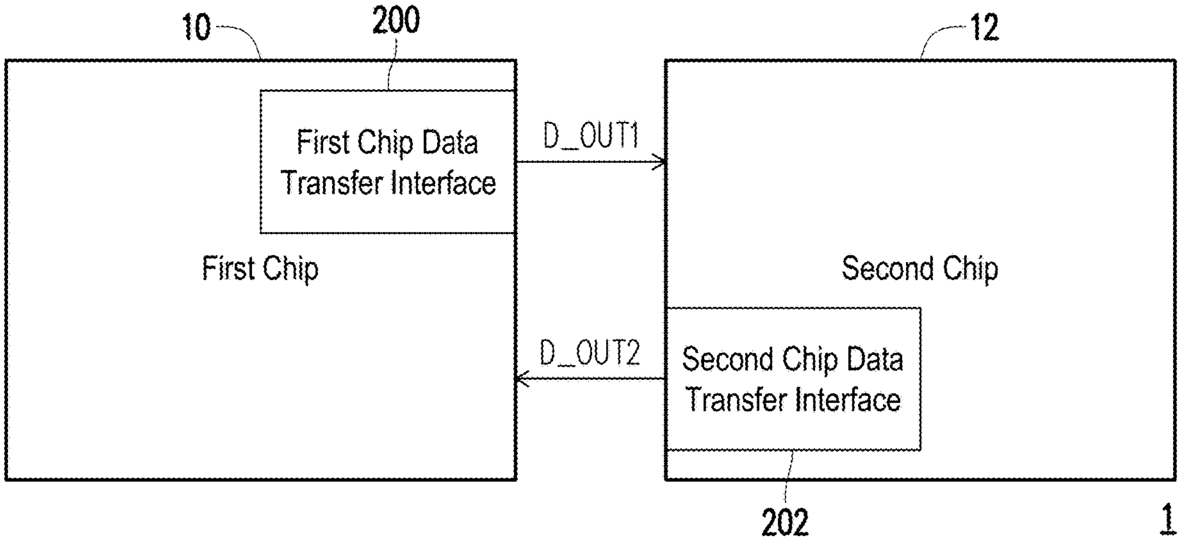
FIG. 1 is a schematic diagram of a semiconductor device according to an embodiment of the disclosure.

The embodiments of the disclosure shown in the accompanying drawings will be illustrated below to assist readers in fully understanding the methods, equipment and/or systems described in the disclosure. Therefore, for persons skilled in the art, various changes, modifications or equivalent substitutions may be suggested for the systems, equipment and/or methods described in the disclosure. In addition, in order to make the content of the disclosure more comprehensible, descriptions of known functions and structures might be omitted. Furthermore, where possible, the same reference numerals are used in the drawings and descriptions to refer to the same or similar parts.

Dynamic voltage/frequency scaling is a smart load management technology that may dynamically adjust a voltage supplied to a chip and dynamically adjust an operation frequency of the chip based on a current workload of the chip. It is worth noting that when dynamic voltage/frequency scaling is operated, a temperature of a silicon junction of the chip may also change accordingly. For a data transfer interface of the chip, the operation of dynamic voltage/frequency scaling often leads to additional digital delay generated by the chip, affecting a setup/hold timing margin of the data transfer interface, which might cause a wrong data transfer.

According to the disclosure, a phase modulation circuit is disposed in the data transfer interface of the chip and configured to adjust a clock phase in the data transfer interface to allow the data transfer interface to be unaffected by digital delay. In this way, the chip may be ensured that the setup/hold timing margin of the data transfer interface may not be affected during the operation of dynamic voltage/frequency scaling in order to correctly perform digital data transfer.

FIG. 1 is a schematic diagram of a semiconductor device according to an embodiment of the disclosure. A semiconductor device 1 includes a first chip 10 and a second chip 12. The first chip 10 has a first chip data transfer interface 200 (or called a chip data transfer interface), and is coupled to the second chip 12 through the first chip data transfer interface 200. In this way, the first chip 10 may transfer a first output data signal D_OUT1 to the second chip 12 through the chip data transfer interface 200. In addition, the second chip 12 may also be provided with a second chip data transfer interface 202 (or called a chip data transfer interface), and is coupled to the first chip 10 through the second chip data transfer interface 202. In this way, the second chip 12 may transfer a second output data signal D_OUT2 to the first chip 10 through the second chip data transfer interface 202.

Figure 2:
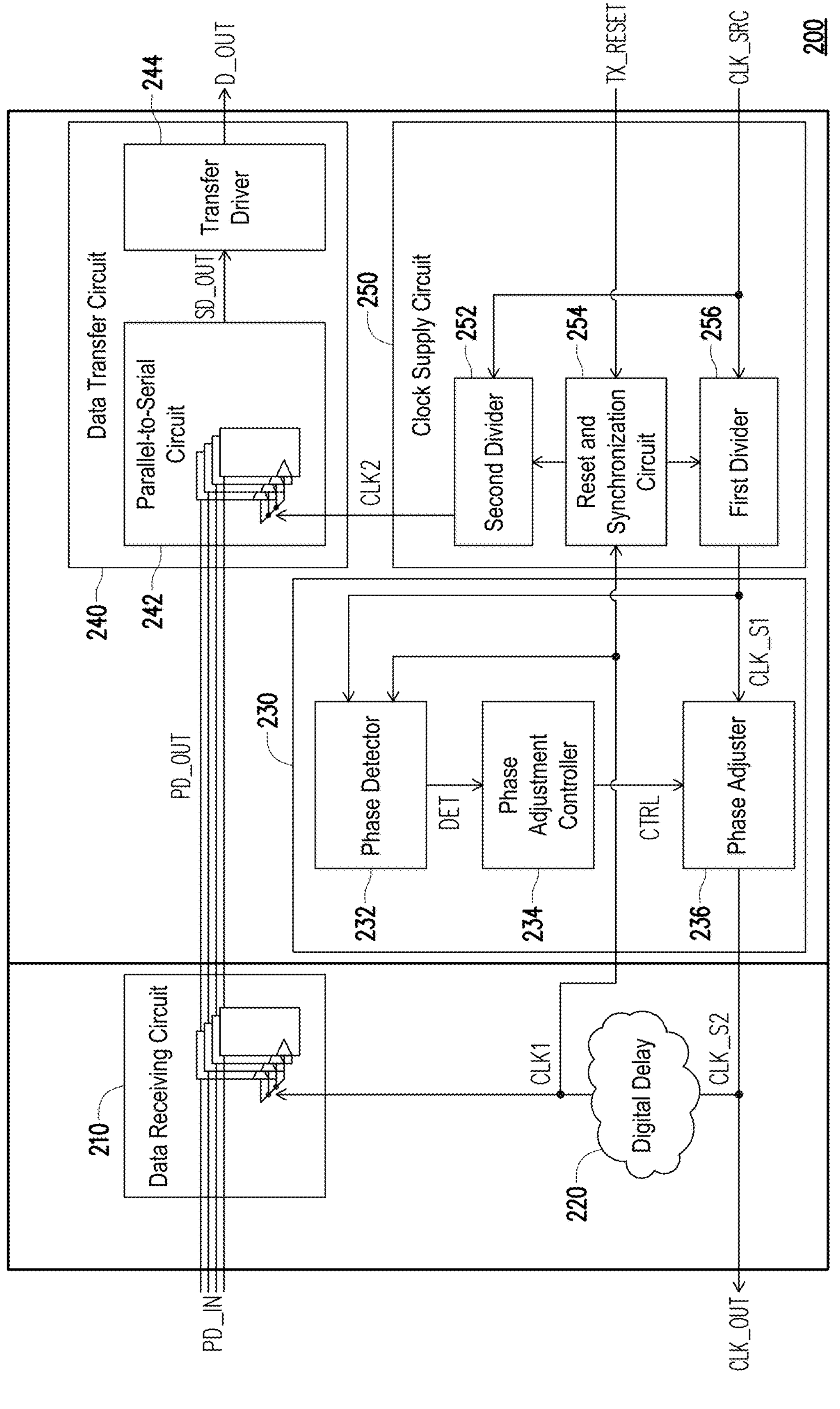
FIG. 2 is a schematic diagram of a chip data transfer interface according to an embodiment of the disclosure.

FIG. 2 is a schematic diagram of a chip data transfer interface according to an embodiment of the disclosure.

In FIG. 2, the chip data transfer interface 200 includes a data receiving circuit 210, a data transfer circuit 240, a clock supply circuit 250, and a phase modulation circuit 230. The data receiving circuit 210 is configured to receive a parallel input data PD_IN according to a first operation clock CLK1, and send a parallel output data PD_OUT. The data transfer circuit 240 is coupled to the data receiving circuit 210, and configured to receive the parallel output data PD_OUT based on a second operation clock CLK2, and send a serial data SD_OUT. The clock supply circuit 250 is coupled to the data receiving circuit 210 and the data transfer circuit 240. The clock supply circuit 250 generates a system clock CLK_S1 and the second operation clock CLK2 based on a source clock CLK_SRC. The phase modulation circuit 230 is coupled to the data receiving circuit 210 and the clock supply circuit 250. The phase modulation circuit 230 is configured to receive the system clock CLK_S1 and the first operation clock CLK1, and allow the first operation clock CLK1 to be in phase with the system clock CLK_S1. When the first operation clock CLK1 is in phase with the system clock CLK_S1, the clock supply circuit 250 outputs the second operation clock CLK2 to the data transfer circuit 240, and the second operation clock CLK2 is synchronized with the first operation clock CLK1.

Refer to FIG. 2 again. After the clock supply circuit 250 receives a reset signal TX_RESET, the system clock CLK_S1 is immediately generated based on the source clock CLK_SRC. The system clock CLK_S1 forms the first operation clock CLK1 through the phase modulation circuit 230 and a digital delay 220 to be used by the data receiving circuit 210. At this time, there is a slight phase difference between the first operation clock CLK1 and the system clock CLK_S1. In addition, the first operation clock CLK1 is also sent to the clock supply circuit 250 to drive the clock supply circuit 250 to allow the clock supply circuit 250 to output the second operation clock CLK2 that is synchronized with the first operation clock CLK1 to be used by the data transfer circuit 240. In this way, the data transfer circuit 240 may smoothly receive the parallel output data PD_OUT sent from the data receiving circuit 210 based on the second operation clock CLK2.

However, in the foregoing operation, the chip data transfer interface 200 might generate an excessive digital delay 220 due to the operation of dynamic voltage/frequency scaling. The excessive digital delay 220 may expand the phase difference between the first operation clock CLK1 and the system clock CLK_S1. This may lead to the data transfer circuit 240 to being unable to smoothly receive the parallel output data PD_OUT sent from the data receiving circuit 210 based on the second operation clock CLK2. In the foregoing embodiment, the excessive digital delay 220 might be a delay generated by the chip data transfer interface 200 during the operation of dynamic voltage/frequency scaling, but the disclosure is not limited thereto. Other possible factors might also lead to generating the excessive digital delay 220 between the first operation clock CLK1 and the system clock CLK_S1.

Refer to FIG. 2 again. The phase modulation circuit 230 disposed in the chip data transfer interface 200 may be configured to solve the foregoing problem of data transfer generated by the excessive digital delay 220. The phase modulation circuit 230 computes and adjusts according to the system clock CLK_S1 and the first operation clock CLK1 that are received to allow the phase of the first operation clock CLK1 to achieve consistency with the phase of the system clock CLK_S1, that is, to be in phase. At this time, the clock supply circuit 250 outputs the second operation clock CLK2 that is synchronized with the first operation clock CLK1 to the data transfer circuit 240 according to the first operation clock CLK1. In this way, the data transfer circuit 240 may correctly receive the parallel output data PD_OUT sent from the data receiving circuit 210 based on the second operation clock CLK2.

In addition, when the excessive digital delay 220 occurs, the operation of the phase modulation circuit 230 may maintain the first operation clock CLK1 to be in phase with the system clock CLK_S1 without being affected to allow the data transfer circuit 240 to continue and correctly receive the parallel output data PD_OUT sent from the data receiving circuit 210 based on the second operation clock CLK2. That is to say, the chip data transfer interface 200 may be ensured that the setup/hold timing margin may not be affected in a condition where dynamic voltage/frequency scaling is utilized to reduce power consumption in order to correctly perform digital data transfer.

Refer to FIG. 2 again. The clock supply circuit 250 includes a first divider 256, a second divider 252, and a reset and synchronization circuit 254. The first divider 256 generates the system clock CLK_S1 based on the source clock CLK_SRC. The second divider 252 generates the second operation clock CLK2 based on the source clock CLK_SRC. The reset and synchronization circuit 254 is coupled to the first divider 256 and the second divider 252. The reset and synchronization circuit 254 enables the first divider 256 based on the reset signal TX_RESET to allow the first divider 256 to output the system clock CLK_S1. In addition, the reset and synchronization circuit 254 may enable the second divider 252 when the system clock CLK_S1 is in phase with the first operation clock CLK1 to allow the second divider 252 to output the second operation clock CLK2.

Refer to FIG. 2 again. The phase modulation circuit 230 includes a phase detector 232, a phase adjustment controller 234, and a phase adjuster 236. The phase detector 232 is configured to detect the phase difference between the system clock CLK_S1 and the first operation clock CLK1, and outputs a detection signal DET based on the phase difference. Furthermore, the detection signal DET may be configured to indicate a phase relationship between the system clock CLK_S1 and the first operation clock CLK1, such as lead or late. In other words, the phase detector 232 may be configured to: output the detection signal DET in response to the phase of the system clock CLK_S1 leading or lagging behind the phase of the first operation clock CLK1.

The phase adjustment controller 234 is coupled to the phase detector 232, and outputs a control signal CTRL based on the detection signal DET. The phase adjuster 236 is coupled to the phase adjustment controller 234 and the clock supply circuit 250, and receives the system clock CLK_S1 from the clock supply circuit 250, and adjusts the phase of the system clock CLK_S1 based on the control signal CTRL in order to output an adjusted system clock CLK_S2. The adjusted system clock CLK_S2 forms the first operation clock CLK1 through the digital delay 220.

In other words, in order to maintain the system clock CLK_S1 to be in phase with the first operation clock CLK1, when the digital delay 220 occurs and leads to a phase shift in the first operation clock CLK1, the phase modulation circuit 230 may correspondingly adjust the first operation clock CLK1 based on a change in the digital delay 220 to allow the first operation clock CLK1 to be back in phase with the system clock CLK_S1.

It should be noted that the phase detector 232, the phase adjustment controller 234, and the phase adjuster 236 may be implemented by utilizing a circuit, but the disclosure does not limit the detailed circuit structure.

Refer to FIG. 2 again. The data transfer circuit 240 includes a parallel-to-serial circuit 242 and a transfer driver 244. The parallel-to-serial circuit 242 is coupled to the data receiving circuit 210, and configured to convert the parallel output data PD_OUT to the serial data SD_OUT. The transfer driver 244 is coupled to the parallel-to-serial circuit 242, and configured to receive the serial data SD_OUT and send an output data signal D_OUT.

Refer to FIG. 2 again. The system clock CLK_S1 may pass through the phase adjuster 236, and the system clock CLK_S1 may carry an initial code at first. The initial code may be configured to indicate the phase of the system clock CLK_S1. For example, when the phase adjuster 236 is a phase interpolator, the initial code may include a quadrant code qrt [1:0] and a phase code phase_code (not shown in the figure). In an embodiment, the quadrant code qrt [1:0] may be configured to indicate a phase quadrant of a signal, and the phase code phase_code may be configured to indicate a phase angle of the signal. Alternatively, when the phase adjuster 236 is a delay line, the initial code may include a quantity of buffers enabled by the delay line to perform the delay, but the disclosure is not limited thereto. In addition, the system clock CLK_S1 passes through the phase adjuster 236, and the phase adjuster 236 may apply an initial delay T_ini (not shown in the figure) (such as analog delay) on the system clock CLK_S1 to generate the adjusted system clock CLK_S2.

Then, the adjusted system clock CLK_S2 may become the first operation clock CLK1 after passing through the digital delay 220. It should be noted that the reason of forming the digital delay 220 might be the delay caused by dynamic voltage/frequency scaling of the digital circuit. In addition, the reason of forming the digital delay 220 further includes the delay caused by the buffers needed when the system clock CLK_S1 is transferred to the data receiving circuit 210, but the disclosure is not limited thereto.

Next, the first operation clock CLK1 is sent back to the phase modulation circuit 230 and the clock supply circuit 250. More specifically, the first operation clock CLK1 may be provided to the phase detector 232 and the reset and synchronization circuit 254. The phase detector 232 may be configured to compare the phase relationship between the first operation clock CLK1 and the system clock CLK_S1 to generate the detection signal DET.

In an embodiment, the detection signal DET may include a phase lead signal P_LEAD and a phase late signal P_LATE (not shown in the figure). For example, the detection signal DET may be configured to indicate the phase lead signal P_LEAD in response to the first operation clock CLK1 leading the system clock CLK_S1. On the other hand, the detection signal DET indicates the phase late signal P_LATE in response to the first operation clock CLK1 lagging behind the system clock CLK_S1. That is to say, when the first operation clock CLK1 leads, the phase lead signal P_LEAD may be enabled, and the phase late signal P_LATE is disabled. Conversely, when the first operation clock CLK1 lags, the phase late signal P_LATE may be enabled, and the phase lead signal P_LEAD is disabled.

The detection signal DET may be provided to the phase adjustment controller 234. In an embodiment, the phase adjustment controller 234 may be configured to output the control signal CTRL based on the detection signal DET. In addition, the control signal CTRL is configured to control the phase adjuster 236 to adjust the phase of the system clock CLK_S1 in order to change the phase of the adjusted system clock CLK_S2 and the phase of the first operation clock CLK1 to allow the phase of the first operation clock CLK1 to be aligned with the system clock CLK_S1. For example, the control signal CTRL may include a target phase desired to be adjusted to or a differential phase expected to be changed. In addition, when the phase adjuster 236 is a phase interpolator, the control signal CTRL may include the quadrant code qrt [1:0] (that is, a phase quadrant) and the phase code phase_code (that is, a phase angle) (not shown in the figure). Alternatively, when the phase adjuster 236 is a delay line, the control signal CTRL may include the quantity of buffers enabled by the delay line to perform the delay.

Whether a delay line or a phase interpolator is utilized to perform analog delay, the delay applied on the system clock CLK_S1 by the phase adjuster 236 is aimed to allow the phase of the first operation clock CLK1 to be aligned with the system clock CLK_S1. Utilizing a comparison result of the phase detector 232 (that is, lead or late), the phase adjustment controller 234 may adjust the phase output of the phase adjuster 236 until the first operation clock CLK1 is phase-locked with the system clock CLK_S1. In addition, the phase adjustment controller 234 has a voting decision-making mechanism and overflow judgment processing to avoid misjudgments caused by high-frequency data jitter or unequal sampling interval.

After phase-locking, the reset and synchronization circuit 254 enables the second divider 252 based on the first operation clock CLK1 to allow the second divider 252 to divide the source clock CLK_SRC in order to generate the second operation clock CLK2 that is synchronized with the first operation clock CLK1. That is to say, the first operation clock CLK1 and the second operation clock CLK2 at this time may be synchronized and kept a fixed phase relationship. Therefore, the chip data transfer interface 200 may have a safe setup/hold timing margin in order to correctly perform digital data transfer.

When the chip data transfer interface 200 needs to reduce power consumption and perform dynamic voltage/frequency scaling, the system timing may be inevitably changed (that is, the digital delay 220). At this time, the phase detector 232 may detect that the first operation clock CLK1 and the system clock CLK_S1 are out of phase lock. The phase adjustment controller 234 may utilize the comparison result of the phase detector 232 to control the phase adjuster 236 to allow continuous adjustments of the phase of the first operation clock CLK1 until the first operation clock CLK1 and the system clock CLK_S1 are phase-locked again. In this way, through utilizing this offset correction method, the first operation clock CLK1 and the second operation clock CLK2 may be synchronized and kept a fixed phase relationship without being affected by the digital delay 220 to ensure that the setup/hold time margin on the chip data transfer interface 200 may not be affected in order to correctly perform digital data transfer.

Figure 3:
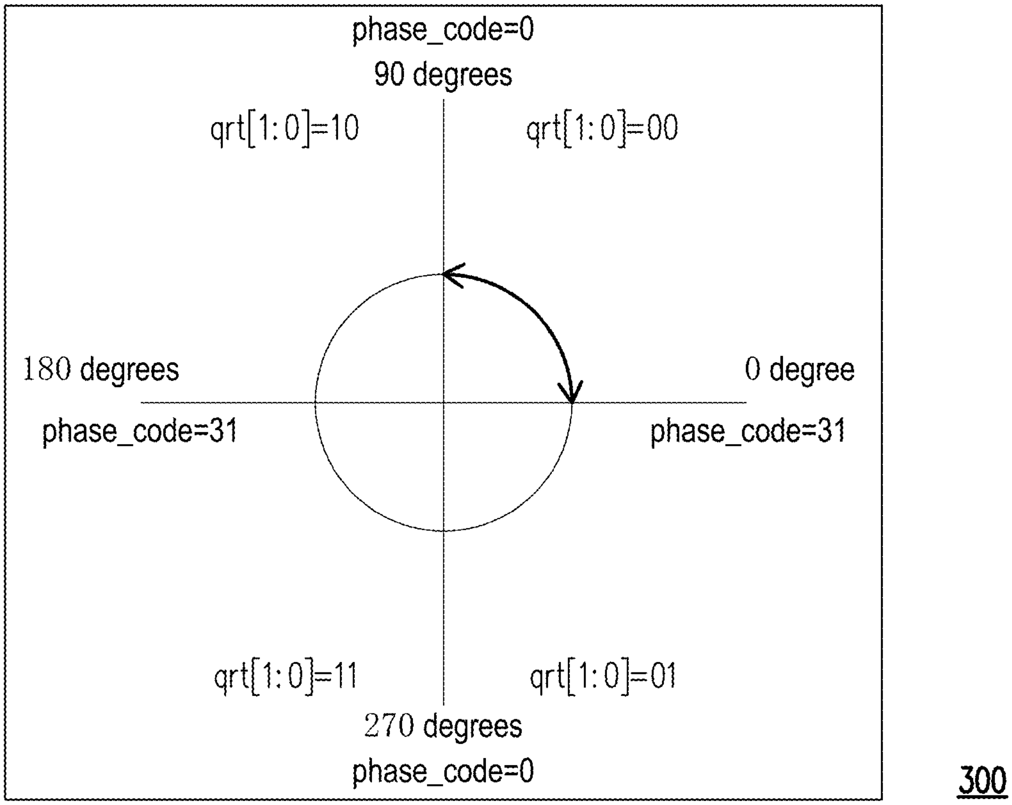
FIG. 3 is a schematic diagram of an operation scenario of a phase modulation circuit according to an embodiment of the disclosure.

FIG. 3 is a schematic diagram of an operation scenario of a phase modulation circuit according to an embodiment of the disclosure. When a phase interpolator serves as an embodiment of the phase adjuster 236, an operation scenario 300 in FIG. 3 presents a relationship between a phase of the adjusted system clock CLK_S2 and the control signal CTRL in FIG. 2. The phase of the adjusted system clock CLK_S2 may be divided into four quadrants. In the first quadrant, the phase of the adjusted system clock CLK_S2 may be 0 degree to 90 degrees. In the second quadrant, the phase of the adjusted system clock CLK_S2 may be 90 degrees to 180 degrees. In the third quadrant, the phase of the adjusted system clock CLK_S2 may be 180 degrees to 270 degrees. In the fourth quadrant, the phase of the adjusted system clock CLK_S2 may be 270 degrees to 0 degree. It is worth mentioning that the relationship between the phase of the adjusted system clock CLK_S2 and the control signal CTRL may have different relationships based on different designs.

Refer to FIG. 2 and FIG. 3 again. The control signal CTRL includes the quadrant code qrt [1:0] and the phase code phase_code. By a change of the quadrant code qrt [1:0] and the phase code phase_code, the control signal CTRL may control the phase of the adjusted system clock CLK_S2. Furthermore, the quadrant code qrt [1:0] is configured to switch the quadrant corresponding to the phase of the adjusted system clock CLK_S2. The phase code phase_code is configured to control the phase of the adjusted system clock CLK_S2. For example, when the quadrant code qrt [1:0] is 00, the phase of the adjusted system clock CLK_S2 is disposed in the first quadrant, and a range of the phase may be 0 degree to 90 degrees. When the phase code phase_code is 31, the phase of the adjusted system clock CLK_S2 is 0 degree. When the phase code phase_code is 0, the phase of the adjusted system clock CLK_S2 is 90 degrees. In other words, when the phase code phase_code gradually decreases from 31 to 0, the phase of the adjusted system clock CLK_S2 gradually increases from 0 degree to 90 degrees.

Figure 4A:
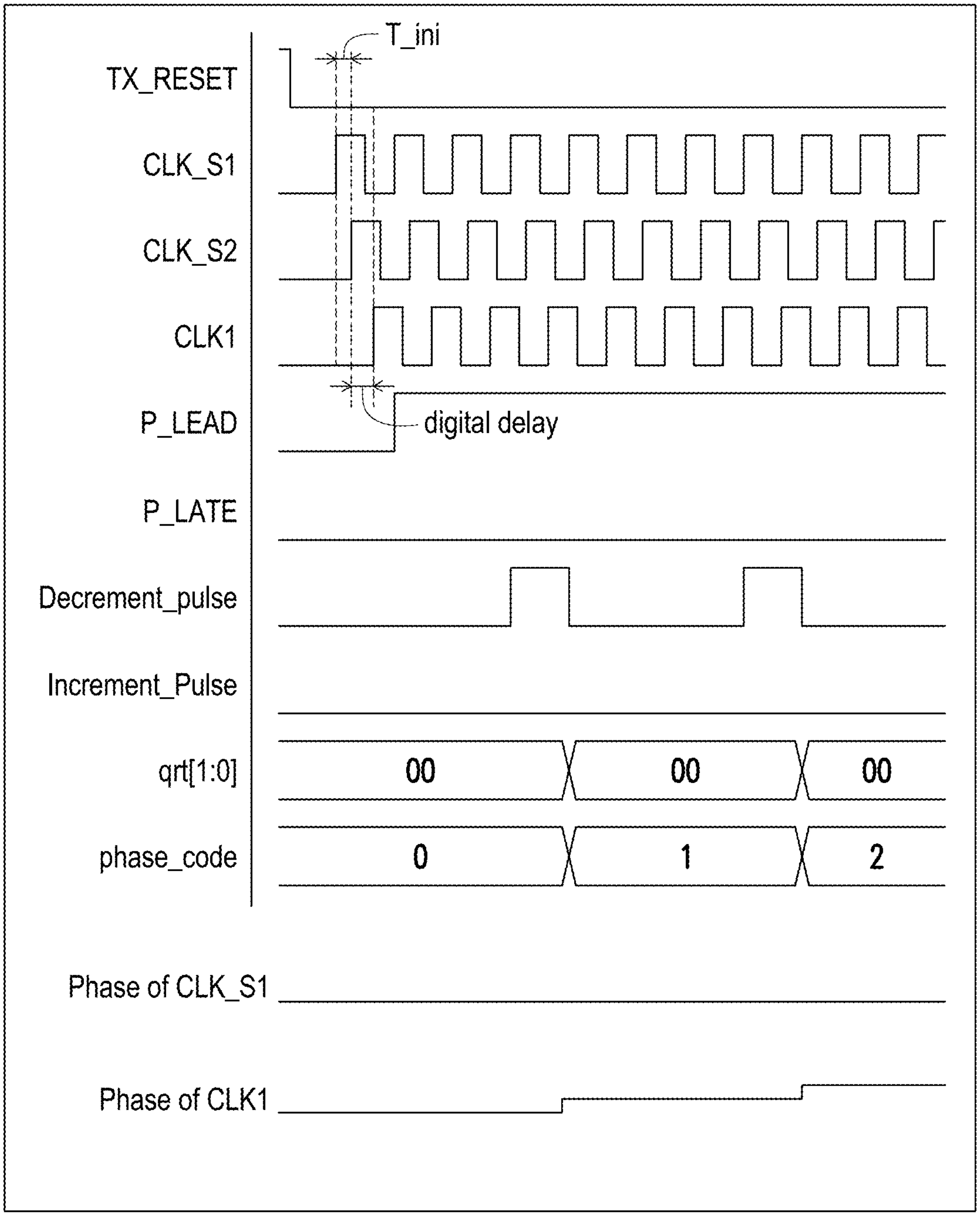
FIG. 4A is a schematic diagram of an operation timing of a phase modulation circuit according to an embodiment of the disclosure.
Figure 4B:
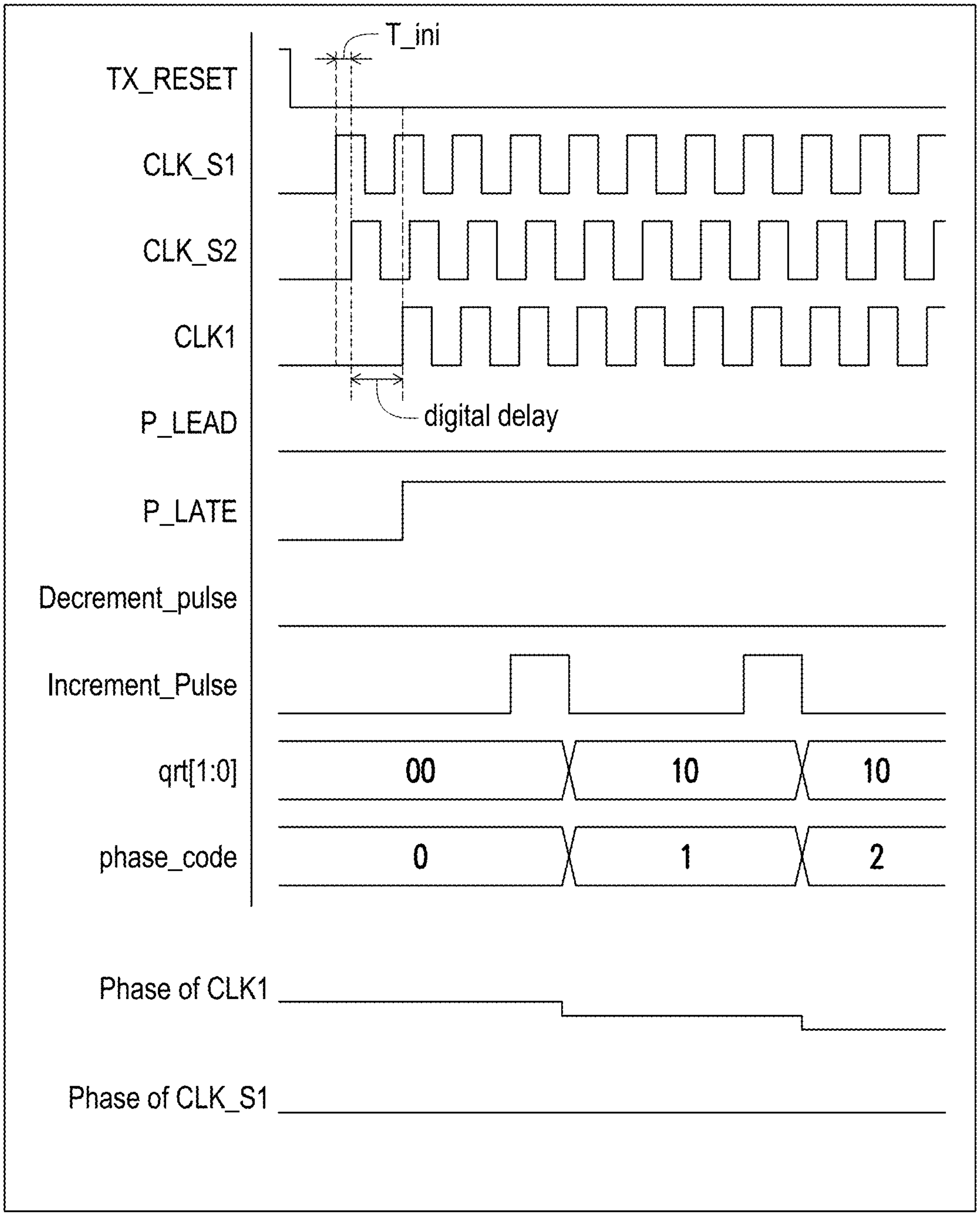
FIG. 4B is a schematic diagram of an operation timing of a phase modulation circuit according to an embodiment of the disclosure.

FIG. 4A is a schematic diagram of an operation timing of a phase modulation circuit according to an embodiment of the disclosure. FIG. 4B is a schematic diagram of an operation timing of a phase modulation circuit according to an embodiment of the disclosure. Referring to FIG. 2, an operation timing 400A in FIG. 4A illustrates a condition where the first operation clock CLK1 leads the system clock CLK_S1, and an operation timing 400B in FIG. 4B illustrates a condition where the first operation clock CLK1 lags behind the system clock CLK_S1.

Please refer to FIG. 4A. The system clock CLK_S1 may become the adjusted system clock CLK_S2 after passing through the initial delay T_ini applied by the phase adjuster 236. In addition, the adjusted system clock CLK_S2 may become the first operation clock CLK1 after passing through the digital delay 220. At this time, since a first rising edge of the first operation clock CLK1 leads a second rising edge of the system clock CLK_S1, it is indicated that the first operation clock CLK1 leads the system clock CLK_S1.

Therefore, the phase lead signal P_LEAD is enabled. In addition, a phase decrement pulse Decrement_Pulse may be triggered to decrement the phase of the adjusted system clock CLK_S2 in order to decrement the phase of the first operation clock CLK1. Furthermore, the phase adjuster 236 is controlled by the quadrant code qrt [1:0] and the phase code phase_code to gradually decrement the phase of the adjusted system clock CLK_S2 and the phase the first operation clock CLK1 until the first operation clock CLK1 is in phase with the system clock CLK_S1.

Please refer to FIG. 4B. The system clock CLK_S1 may become the adjusted system clock CLK_S2 after passing through the initial delay T_ini applied by the phase adjuster 236. In addition, the adjusted system clock CLK_S2 may become the first operation clock CLK1 after passing through the digital delay 220. At this time, since the first rising edge of the first operation clock CLK1 lags behind the second rising edge of the system clock CLK_S1, it is indicated that the first operation clock CLK1 lags behind the system clock CLK_S1.

Therefore, the phase late signal P_LATE is enabled. In addition, a phase increment pulse Increment_Pulse may be triggered to increment the phase of the adjusted system clock CLK_S2 in order to increment the phase of the first operation clock CLK1. Furthermore, the phase adjuster 236 is controlled by the quadrant code qrt [1:0] and the phase code phase_code to gradually increment the phase of the adjusted system clock CLK_S2 and the phase of the first operation clock CLK1 until the first operation clock CLK1 is in phase with the system clock CLK_S1.

Figure 5:
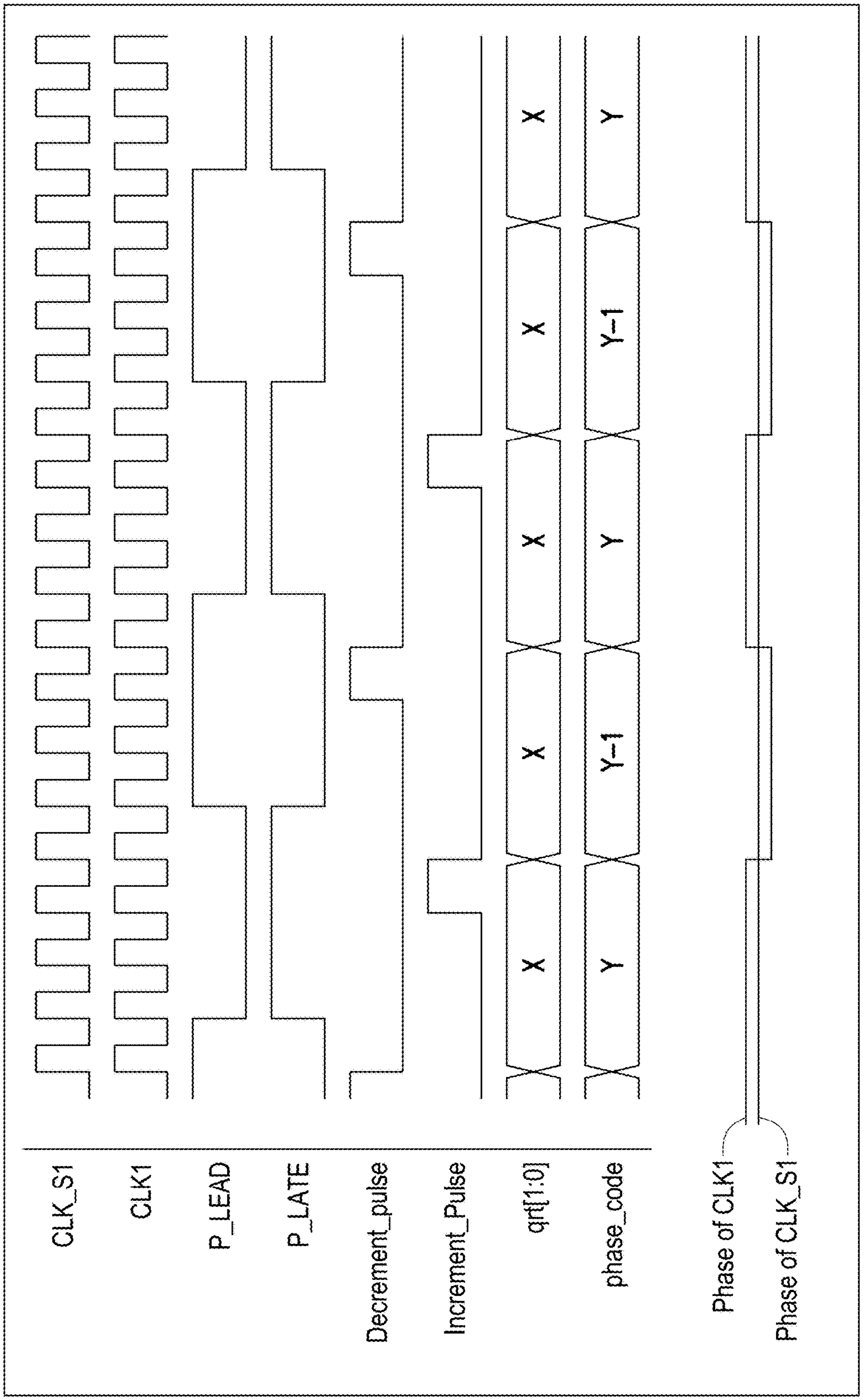
FIG. 5 is a schematic diagram of an operation timing of a phase modulation circuit according to an embodiment of the disclosure.

FIG. 5 is a schematic diagram of an operation timing of a phase modulation circuit according to an embodiment of the disclosure. Referring to FIG. 2, an operation timing 500 in FIG. 5 illustrates a condition where both the first operation clock CLK1 and the system clock CLK_S1 are phase-locked.

As shown in FIG. 5, when the first operation clock CLK1 and the system clock CLK_S1 are out of lock, the phase of the first operation clock CLK1 may be incremented or decremented to allow both the first operation clock CLK1 and the system clock CLK_S1 to be kept phase-locked.

In this way, the first operation clock CLK1 and the second operation clock CLK2 may be synchronized and kept a fixed phase relationship without being affected by the digital delay 220 in order to ensure that the setup/hold time margin on the chip data transfer interface 200 may not be affected to correctly perform digital data transfer.

Based on the above, the chip data transfer interface and the semiconductor device of the disclosure may keep the system clock and the first operation clock to be phase-locked. Therefore, the data of the chip data transfer interface can be normally transferred. That is to say, the chip data transfer interface may ensure that the setup/hold timing margin of the chip data transfer interface may not be affected in a condition where dynamic voltage/frequency scaling is utilized to reduce power consumption in order to correctly perform digital data transfer.

Persons skilled in the art may make some changes and modifications without departing from the spirit and scope of the disclosure. Therefore, it should be understood that the invention disclosed herein is not limited to the specific embodiments disclosed, and is intended to cover modifications within the spirit and scope of the disclosure.

What is claimed is:

1. A chip data transfer interface, comprising:

a data receiving circuit, configured to receive a parallel input data according to a first operation clock, and send a parallel output data;

a data transfer circuit, coupled to the data receiving circuit, and configured to receive the parallel output data based on a second operation clock, and send a serial data;

a clock supply circuit, coupled to the data receiving circuit and the data transfer circuit, and the clock supply circuit configured to generate a system clock and the second operation clock based on a source clock; and a phase modulation circuit, coupled to the data receiving circuit and the clock supply circuit, the phase modulation circuit configured to receive the system clock and the first operation clock, and allowing the first operation clock to be in phase with the system clock;

wherein when the first operation clock is in phase with the system clock, the clock supply circuit is configured to output the second operation clock, and the second operation clock is synchronized with the first operation clock.

2. The chip data transfer interface according to claim 1, wherein the system clock forms the first operation clock through the phase modulation circuit and a digital delay.

3. The chip data transfer interface according to claim 1, wherein the clock supply circuit comprises:

a first divider, configured to generate the system clock based on the source clock;

a second divider, configured to generate the second operation clock based on the source clock; and a reset and synchronization circuit, coupled to the first divider and the second divider, the reset and synchronization circuit configured to enable the first divider based on a reset signal, and enable the second divider when the system clock is in phase with the first operation clock.

4. The chip data transfer interface according to claim 1, wherein the phase modulation circuit comprises:

a phase detector, configured to detect a phase difference between the system clock and the first operation clock, and output a detection signal based on the phase difference;

a phase adjustment controller, coupled to the phase detector, the phase adjustment controller configured to output a control signal based on the detection signal; and a phase adjuster, coupled to the phase adjustment controller and the clock supply circuit, the phase adjuster configured to receive the system clock, and configured to adjust a phase of the system clock based on the control signal to output an adjusted system clock.

5. The chip data transfer interface according to claim 4, wherein the adjusted system clock forms the first operation clock through a digital delay.

6. The chip data transfer interface according to claim 1, wherein the data transfer circuit comprises:

a parallel-to-serial circuit, coupled to the data receiving circuit, and configured to convert the parallel output data to the serial data; and a transfer driver, coupled to the parallel-to-serial circuit, the transfer driver configured to receive the serial data and send an output data signal.

7. A semiconductor device, comprising:

a first chip, having a chip data transfer interface; and a second chip, coupled to the chip data transfer interface;

wherein the chip data transfer interface comprises:

a data receiving circuit, configured to receive a parallel input data according to a first operation clock, and send a parallel output data;

a data transfer circuit, coupled to the data receiving circuit, configured to receive the parallel output data based on a second operation clock, and send a serial data;

a clock supply circuit, coupled to the data receiving circuit and the data transfer circuit, the clock supply circuit configured to generate a system clock and the second operation clock based on a source clock; and a phase modulation circuit, coupled to the data receiving circuit and the clock supply circuit, the phase modulation circuit configured to receive the system clock and the first operation clock, and allowing the system clock to be in phase with the first operation clock;

wherein when the system clock is in phase with the first operation clock, the clock supply circuit is configured to output the second operation clock, and the second operation clock is synchronized with the first operation clock.

8. The semiconductor device according to claim 7, wherein the system clock forms the first operation clock through the phase modulation circuit and a digital delay.

9. The semiconductor device according to claim 7, wherein the clock supply circuit comprises:

a first divider, configured to generate the system clock based on the source clock;

a second divider, configured to generate the second operation clock based on the source clock; and a reset and synchronization circuit, coupled to the first divider and the second divider, the reset and synchronization circuit configured to enable the first divider based on a reset signal, and enable the second divider when the system clock is in phase with the first operation clock.

10. The semiconductor device according to claim 7, wherein the phase modulation circuit comprises:

a phase detector, configured to detect a phase difference between the system clock and the first operation clock, and output a detection signal based on the phase difference;

a phase adjustment controller, coupled to the phase detector, and the phase adjustment controller configured to output a control signal based on the detection signal; and a phase adjuster, coupled to the phase adjustment controller and the clock supply circuit, the phase adjuster configured to receive the system clock, and configured to adjust a phase of the system clock based on the control signal to output an adjusted system clock.

11. The semiconductor device according to claim 10, wherein the adjusted system clock forms the first operation clock through a digital delay.

12. The semiconductor device according to claim 7, wherein the data transfer circuit comprises:

a parallel-to-serial circuit, coupled to the data receiving circuit, and configured to convert the parallel output data to the serial data; and a transfer driver, coupled to the parallel-to-serial circuit and the second chip, the transfer driver configured to receive the serial data and send an output data signal to the second chip.

* * * * *